United States Patent [19]

Arneson et al.

[11] Patent Number: 4,970,624
[45] Date of Patent: Nov. 13, 1990

[54] ELECTRONIC DEVICE EMPLOYING A CONDUCTIVE ADHESIVE

[75] Inventors: Don A. Arneson, South Elgin; Todd A. Hester, Montgomery, both of Ill.

[73] Assignee: Molex Incorporated, Lisle, Ill.

[21] Appl. No.: 468,458

[22] Filed: Jan. 22, 1990

[51] Int. Cl.$^5$ .......................... H05K 1/00; H05K 1/02
[52] U.S. Cl. .................................... 361/398; 361/417; 361/418; 174/259; 174/262; 29/845
[58] Field of Search ................. 29/829, 832, 837, 844, 29/845; 156/279, 293, DIG. 21; 174/259, 260, 261, 262, 267; 361/386, 387, 398, 405, 406, 413, 417, 418, 419, 421

[56] References Cited

U.S. PATENT DOCUMENTS

| | | | |
|---|---|---|---|
| 4,024,627 | 5/1977 | Stauffer | 29/588 |
| 4,185,378 | 1/1980 | Machida | 361/406 |
| 4,667,401 | 5/1987 | Clements et al. | 29/432 |

Primary Examiner—H. Broome
Assistant Examiner—Donald A. Sparks
Attorney, Agent, or Firm—Louis A. Hecht; Stephen Z. Weiss; Charles S. Cohen

[57] ABSTRACT

An electronic device which includes a circuit sheet having a conductive path thereon. An adhesive is deposited on the conductive path, the adhesive including a nonconductive base incorporating randomly spaced conductive particles. A circuit component is forced through the adhesive, the conductive path and the circuit sheet carrying a portion of the adhesive therewith between the circuit component and the conductive path. The carried portion of the adhesive is compressed for establishing contact between the conductive particles and thereby conductivity between the circuit component and the conductive path leaving the adhesive other than that portion in a nonconductive state.

13 Claims, 2 Drawing Sheets

ELECTRONIC DEVICE EMPLOYING A CONDUCTIVE ADHESIVE

FIELD OF THE INVENTION

This invention generally relates to electronic devices using conductive adhesive and, particularly, to an electronic device wherein the electrical contact through the adhesive is made uniaxially by pressure between a circuit component and a circuit sheet without any extraneous pressure-applying means whatsoever.

BACKGROUND OF THE INVENTION

The use of conductive adhesives are well known in many electrical applications to connect an electrical component to a circuit, particularly to a circuit board having conductive paths in some sort of pattern. Once properly secured, current passes between the electrical component and the conductive path through the conductive adhesive. Such adhesives were developed to replace soldering techniques. Soldering requires spot application whereby depositing of the solder must be precisely controlled and is very difficult with developing micro-electronics. In addition, soldering requires specific temperature resistant components and substrates.

One example of an electrically conductive adhesive which has been developed embodies a nonconductive resin or base having randomly spaced conductive particles therein. The particles are elongated, as in strand or fiber configurations, whereby the adhesive is conductive in the longitudinal direction of the fibers but nonconductive in a direction transverse to the fiber direction. Often, the fibers are magnetically oriented as appropriate for a given application.

Another example of a type of conductive adhesive is where the conductive particles are of a given size sufficiently large to span a predetermined gap between the electrical component and the conductive path. In other words, the particles are spaced a distance greater than the gap whereby when pressure is applied between the electrical component and the conductive path, the particles make contact therebetween but still remained sufficiently spaced parallel to the gap to establish only uniaxial conduction. All of these types of adhesives often are called "Z-axis" adhesives.

A further type of conductive adhesive is shown in U.S. Pat. Nos. 4,667,401, dated May 26, 1987, and 4,720,740, dated Jan. 19, 1988, both to Clements et al. These patents disclose the use of conductive adhesives which rely on a particular concentration of conductive particles in a nonconductive resin whereby upon the application of pressure between the electrical component and the conductive path on a substrate, the particles are moved together in the Z-axis direction, with the resin between the electrical component and the conductive path sort of being "squeezed out" in the X and Y directions so that electrical contact is made between the electrical component and the conductive path through the pressure concentrated conductive particles in the adhesive.

One problem with using some of the conductive adhesives as described above, such as in the above patents, is that extraneous components must be used to apply pressure between the electrical component and the conductive path in the Z-axis direction in order to establish conductivity through the adhesive in the pressure zone. Fixtures must be set up for applying the pressure, and the pressure must be maintained during cure. These procedures are expensive in both the cost of the fixtures and the time required to maintain the external fixturing during adhesive cure. In addition, with the ever increasing miniaturization of electronic devices, fixturing becomes extremely difficult if not impossible.

This invention is directed to a novel electronic device using pressure-sensitive conductive adhesive and which involves internal fixturing in the device itself to completely eliminate any external pressure-applying fixtures.

SUMMARY OF THE INVENTION

An object, therefore, of the invention is to provide a new and improved electronic device employing conductive adhesive.

In the exemplary embodiment of the invention, a circuit sheet is provided with a conductive path thereon overlapping a puncturable area of the sheet. An adhesive is deposited on the conductive path. The adhesive includes a nonconductive base incorporating spaced conductive particles. A circuit component is forced through the adhesive, the conductive path and the circuit sheet. The circuit sheet has sufficient flexibility to deform as the circuit component passes therethrough carrying a portion of the adhesive therewith between the circuit component and the conductive path, and the circuit sheet is sufficiently rigid whereby deformed portions thereof apply pressure against sides of the circuit component to compress the portion of the adhesive for establishing contact between the conductive particles and therefore conductivity between the circuit component and the conductive path, leaving the adhesive other than that portion in a nonconductive state.

In some forms of the invention disclosed herein, a mounting surface such as a substrate is used to increase the rigidity of the circuit sheet, with a clearance hole in the mounting surface into which the circuit/sheet deforms. The hole may be sufficiently large to receive an electronic component having spaced contact portions, with the conductive path including trace portions at spaced locations in the area of the clearance hole for termination with the spaced contact portions of the electronic component. Therefore, the conductive adhesive can establish independent conduction between each contact portion and the respective trace portion of the conductive path. Such an electronic component may comprise a light emitting diode, for instance.

Other forms of the invention show the use of the conductive adhesive with a circuit component having a plurality of leads for puncturing spaced conductive paths on the circuit sheet to establish conductivity therebetween through the circuit component.

It can be seen that the invention advantageously completely eliminates any external fixturing for applying pressure on the component leads and thereby the conductive adhesive in order to effect conductivity through the adhesive. The pressure is applied by the deformed portions of the circuit sheet itself against surfaces of the circuit component with a portion of the conductive adhesive therebetween. In an alternative embodiment, the circuit component exerts pressure on a hard, printed circuit board.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
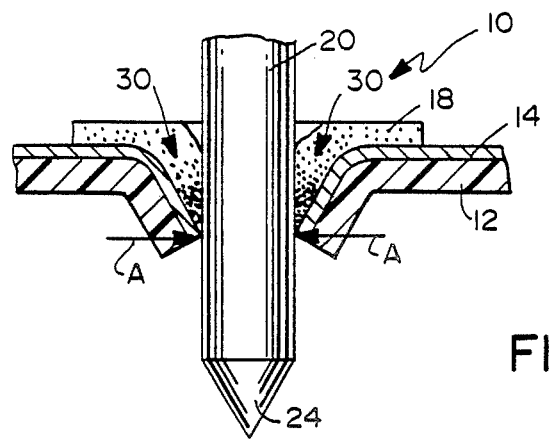
FIG. 1 is a fragmented sectional view through a circuit sheet having a conductive path with a conductive adhesive thereon, and showing a circuit component puncturing the sheet, through the adhesive deposition.
Figure 1A:
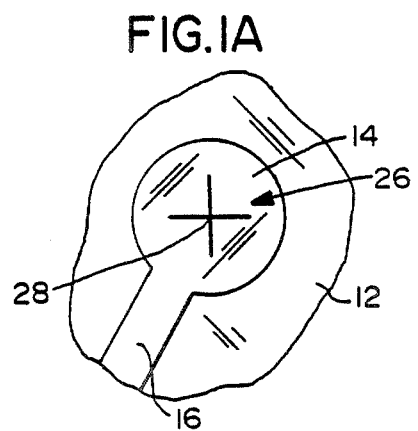
FIGS. 1A and 1B are plan views of two different configurations of puncture means through the conductive path and circuit sheet to facilitate forcing the circuit component therethrough.
Figure 1B:
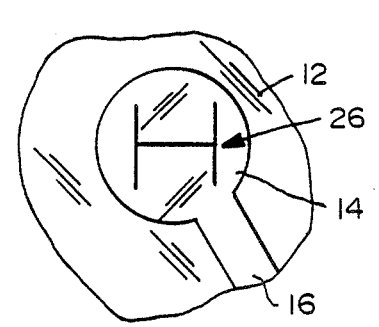

Referring to the drawings in greater detail, and first to FIG. 1, the invention is incorporated in an electronic device, generally designated 10, which includes a circuit sheet 12 having a conductive path 14 thereon. For instance, circuit sheet 12 may be a polyester printed circuit sheet, with conductive path 14 being a pad portion of a screened silver circuit trace 16 as shown in FIGS. 1A and 1B.

The invention contemplates depositing to a layer of conductive adhesive 18 on the conductive path over the area in which a circuit component 20 is to be forced through the conductive path and the circuit sheet, such as through conductive pad 14. Circuit component 20 may comprise a pinlike lead of an electronic component. The conductive adhesive includes a nonconductive base or resin incorporating randomly spaced conductive particles 22. In a normal state of concentration, the conductive particles are spaced sufficiently so that there is no conductivity through the adhesive in any direction. However, as described in the "Background", above, upon application of pressure to the adhesive in a given direction. The particles become concentrated in that direction (e.g., the "Z-axis") squeezing out the non-conductive resin in transverse directions (e.g., the "X" and "Y" axes). In FIG. 1, generally, the "Z" direction of pressure is indicated by arrows "A".

In order to force lead 20 through the adhesive, the conductive path and the circuit sheet, the lead may be pointed, as at 24, to facilitate puncturing the circuit sheet. In addition or in the alternative, referring to FIGS. 1A and 1B, conductive pad 14 and circuit sheet 12 may have puncture means in the form of slits, generally designated 26, of varying configurations. For instance, a cross-shaped slit may be formed as in FIG. 1A to provide four "flaps" diverging toward a center point 28. The slit configuration may be H-shaped as shown in FIG. 1B to provide two opposing flaps. These flaps would engage the sides of lead 20 as shown in FIG. 1 and apply pressure to the adhesive therebetween.

In operation, as lead 20 is forced through conductive path 14 and circuit sheet 12, a portion of the adhesive is carried with the lead between the lead and the conductive path, as indicated in the area generally designated at 30 in FIG. 1. The result is that the forces directed inwardly in the direction of arrows "A" cause conductive particles 22 to become concentrated, squeezing out the nonconductive resin, so that conductivity is established between lead 20 and conductive path 14 through the particle-concentrated portion. of the adhesive. To this end, the invention contemplates that circuit sheet 12 have sufficient flexibility to deform or bend, as shown in the drawing, when the lead is forced through and punctures the circuit sheet. But the sheet must be sufficiently rigid to compress the conductive adhesive in areas 30 for establishing contact between the conductive particles and, thereby, to establish conductivity between the lead and the conductive path, leaving the noncompressed adhesive in a nonconductive state. As stated, a conventional polyester printed circuit sheet would have such properties.

It can be seen that the pressure for effecting conductivity through the conductive adhesive is accomplished by the electronic device 10 itself without requiring any external fixturing whatsoever. The adhesive can cure with the components of the electronic device in their end-product positioning, again completely obviating the need for external fixturing during the curing process. In essence, the concepts of the invention provide a system wherein the device itself provides its own internal fixturing for applying pressure to the conductive adhesive and maintaining that pressure during curing of the adhesive. The saving in cost and time in manufacturing such devices is considerable.

Figure 2:
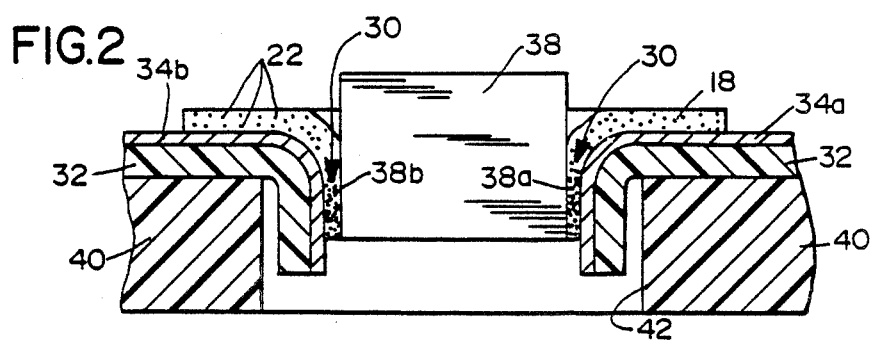
FIG. 2 is a sectional view similar to that of FIG. 1, with the addition of a mounting surface beneath the circuit sheet.

FIG. 2 shows another embodiment of the invention wherein a circuit sheet 32 has a conductive path thereon comprising two conductive trace portions 34a and 34b, whereby conductivity may be desired through a circuit component between the spaced trace portions of the conductive path. For instance, the circuit component may comprise a light emitting diode 38 having spaced contact portions at opposite sides 38a of the diode. It may be desirable to establish a current through the diode between the spaced conductor trace portions 38a, 38b. Using the same concepts as described in relation to FIG. 1, conductive adhesive 18 is used and the deformed portions of circuit sheet 32 concentrate the conductive particles of the adhesive in areas 30 between spaced contact portions 38a of the diode and spaced conductive trace portions 38a, 38b of the conductive path.

FIG. 2 also illustrates the use of the invention wherein additional rigidity is supplied for conductive sheet 32. Specifically, a rigid substrate 40 is shown backing circuit sheet 32, such as with a mounting board of a printed circuit board. The substrate has a clearance hole 42 sufficiently large to receive electronic component 38 and to allow circuit sheet 32 and trace portions 34a, 34b to bend or deform into the clearance hole and apply pressure to the adhesive in areas 30 between the electronic component and the spaced circuit traces 34a, 34b.

Figure 3:
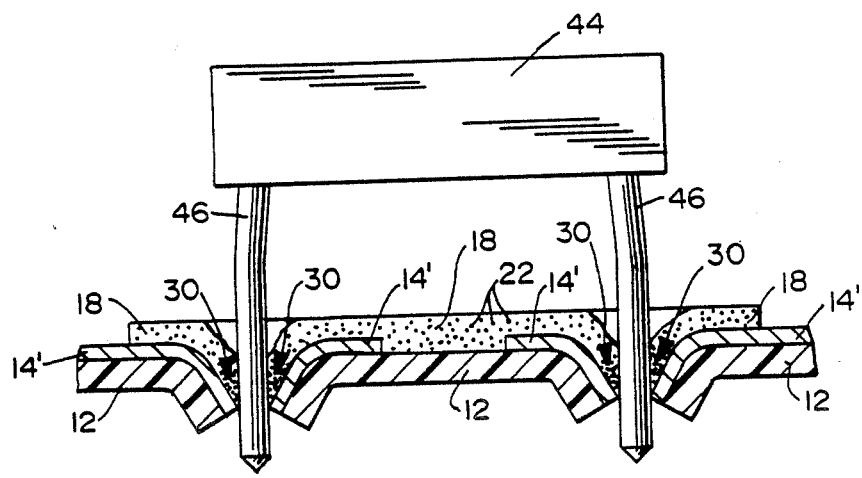
FIG. 3 is a sectional view through a circuit sheet having spaced conductive paths thereon for establishing current through a circuit component having spaced leads.

FIG. 3 shows the utilization of the invention with an electronic component 44 which has a pair of spaced circuit components or leads 46. This application may be used for running current between spaced conductive paths 14' through leads 46 and electronic component 44.

In essence, the assembly and positioning of the parts and the functioning of the invention simply is duplicated about each lead and a comparison can be made directly to the depiction of FIG. 1 and the description thereof, above. It might be noted, however, that adhesive 18 extends across or spans both conductive paths 14'. This simply exemplifies that the adhesive, in its normal state, is nonconductive and will not short between the conductive paths. It is only in areas 30 where conductivity is established through the adhesive due to the concentration of the conductive particles in the adhesive caused by the internal forces applied by the deformed circuit sheet against the sides of leads 46.

Figure 4:
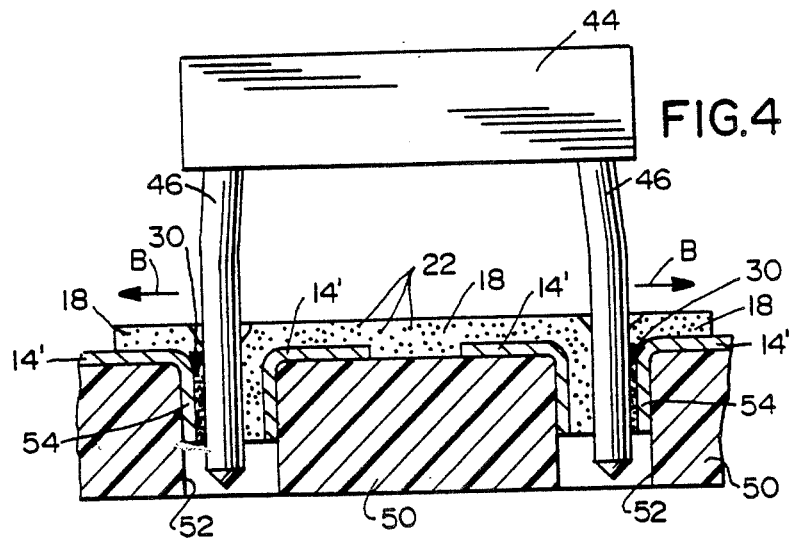
FIG. 4 is a view similar to that of FIG. 3, with the spaced conductive paths deposited directly onto a rigid substrate.

FIG. 4 shows still another application of the invention wherein circuit component 44, having leads 46, is used in a device wherein conductive paths 14' (i.e., similar to FIG. 2) are deposited directly onto a rigid substrate 50 having holes 52 through which leads 46 are positioned. It can be seen that there is no separate circuit sheet. In this embodiment, holes 52 in substrate 50 are eccentric relative to leads 46. In other words, when the leads are forced through conductive paths 14', the leads apply outward pressure in the direction of arrows "B", sandwiching deformed portions 54 of the conductive paths against the interior walls of holes 52. As this occurs, portions of adhesive 18 are carried with the leads and forced as a film of highly concentrated conductive particles 22 between the leads and the conductive paths to establish conductivity therebetween. In essence, substrate 50 forms a circuit sheet of sufficient rigidity to provide an anvil against which leads 46 apply pressure outwardly in the direction of arrows "B" to compress the conductive adhesive carried with the leads and to concentrate the conductive particles in the adhesive. The leads themselves are spring biased inwardly during insertion into the holes in the substrate to effect the necessary pressure for concentrating the conductive particles. Again, the device itself provides internal fixturing which completely obviates the external fixturing and force applying components of the prior art.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electronic device, comprising:
   a mounting surface having a clearance hole therein;
   a circuit sheet on the mounting surface and having a conductive path thereon overlapping the clearance hole in the mounting surface;
   an adhesive deposited on the conductive path over the area of the clearance hole, the adhesive including a nonconductive base incorporating spaced conductive particles;
   a circuit component for forcing through the adhesive, the conductive path and the circuit sheet and into the clearance hole in the mounting surface; and
   wherein the circuit sheet has sufficient flexibility to deform as the circuit component passes therethrough carrying a portion of the adhesive therewith between the circuit component and the conductive path, and the circuitry sheet has sufficient rigidity to compress said portion of the adhesive for establishing electrical contact between the conductive particles and thereby conductivity between the circuit component and the conductive path leaving the adhesive other than said portion in a nonconductive state.

2. The electronic device of claim 1 including a circuit board wherein a substrate portion of the board forms said mounting surface, a polyester film of the board forms said circuit sheet and a conductive trace portion of the board forms said conductive path.

3. The electronic device of claim 2 wherein said circuit component comprises a lead of an electronic component.

4. The electronic device of claim 1 wherein said clearance hole is sufficiently large to receive an electronic component having spaced contact portions, and said conductive path includes trace portions at spaced locations about the clearance hole for conduction with the spaced contact portions of the electronic component, whereby the adhesive can establish independent conduction between each contact portion and the respective trace portion.

5. The electronic device of claim 4 wherein said electronic component comprises a diode.

6. The electronic device of claim 1 wherein said circuit sheet is slitted in the area of the clearance hole to facilitate forcing the circuit component therethrough.

7. An electronic device, comprising:
   a circuit sheet having a conductive path thereon;
   an adhesive deposited on the conductive path, the adhesive including a nonconductive base incorporating spaced conductive particles;
   a circuit component for forcing through the adhesive, the conductive path and the circuit sheet; and
   wherein the circuit sheet has sufficient flexibility to deform and bias against sides of the circuit component as the circuit component passes therethrough carrying a portion of the adhesive therewith between the circuit component and the conductive path, and the circuit sheet has sufficient rigidity so that deformed portions thereof compress said portion of the adhesive for establishing contact between the conductive particles and thereby conductivity between the circuit component and the conductive path leaving the adhesive other than said portion in a nonconductive state.

8. The electronic device of claim 7 wherein said circuit component comprises a lead of an electronic component.

9. The electronic device of claim 7 wherein a pair of spaced conductive paths are provided on the circuit sheet with said adhesive being deposited over each circuit path, and including an electronic component having spaced circuit components in the form of leads for forcing through the adhesive, the spaced conductive paths and the circuit sheet to establish conductivity between the spaced leads and the respective spaced conductive paths.

10. The electronic device of claim 7 wherein said circuit sheet has puncture means to facilitate forcing the circuit component therethrough.

11. The electronic device of claim 10 wherein said puncture means comprise slit means through the circuit sheet to define deformable flaps for applying pressure inwardly against sides of the circuit component.

12. An electronic device, comprising:
   a rigid mounting surface having a clearance hole therethrough and a conductive path thereon spanning the clearance hole;

an adhesive deposited on the conductive path over the area of the clearance hole, the adhesive including a nonconductive base incorporating spaced conductive particles; and a circuit component having a lead for forcing through the adhesive and the conductive path and into the clearance hole in the mounting surface in an eccentric position relative to the clearance hole, the lead being biased toward an interior wall of the clearance hole whereby the lead carries a portion of the adhesive therewith and the biasing of the lead compresses said portion of the adhesive for establishing contact between the conductive particles thereof and thereby conductivity between the lead and the conductive path within the clearance hole.

13. The electronic device of claim 12 including a pair of spaced clearance holes in said mounting surface, with spaced conductive paths covering each spaced hole, and including an electronic component having a pair of leads which are spaced a distance greater than the distance between the centers of the clearance holes whereby upon insertion of the leads into the holes, the leads are spring biased outwardly to compress the adhesive between the leads and the respective conductive paths within the respective clearance holes.

* * * * *